US010062445B2

(12) United States Patent
Hunt-Schroeder et al.

(10) Patent No.: US 10,062,445 B2
(45) Date of Patent: Aug. 28, 2018

(54) PARALLEL PROGRAMMING OF ONE TIME PROGRAMMABLE MEMORY ARRAY FOR REDUCED TEST TIME

(71) Applicant: GLOBALFOUNDRIES INC., Grand Cayman (KY)

(72) Inventors: Eric D. Hunt-Schroeder, South Burlington, VT (US); Steven Lamphier, Colchester, VT (US); Darren L. Anand, Williston, VT (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 15/367,815

(22) Filed: Dec. 2, 2016

(65) Prior Publication Data

US 2018/0158532 A1  Jun. 7, 2018

(51) Int. Cl.
*G11C 17/18* (2006.01)
*G11C 17/16* (2006.01)

(52) U.S. Cl.
CPC .............. *G11C 17/18* (2013.01); *G11C 17/16* (2013.01)

(58) Field of Classification Search
CPC ............................... G11C 17/18; G11C 17/16
See application file for complete search history.

(56) References Cited

U.S. PATENT DOCUMENTS

| 4,868,823 A | | 9/1989 | White, Jr. et al. | |
|---|---|---|---|---|
| 5,638,324 A | * | 6/1997 | Sim | G11C 16/107 365/185.11 |
| 6,161,204 A | * | 12/2000 | Gans | G11C 29/028 714/718 |
| 8,644,061 B2 | * | 2/2014 | Hwang | G11C 11/5678 365/148 |
| 9,177,650 B2 | | 11/2015 | Wang et al. | |
| 2003/0193823 A1 | * | 10/2003 | Takahashi | G11C 29/50 365/145 |
| 2004/0190336 A1 | * | 9/2004 | Confalonieri | G11C 11/5628 365/185.03 |
| 2006/0203599 A1 | * | 9/2006 | Doyle | G11C 29/02 365/230.06 |
| 2006/0244099 A1 | * | 11/2006 | Kurjanowicz | G11C 17/16 257/530 |
| 2009/0055577 A1 | * | 2/2009 | Moon | G11C 16/10 711/103 |
| 2009/0235040 A1 | * | 9/2009 | Chilumula | G11C 7/062 711/170 |
| 2010/0046297 A1 | * | 2/2010 | Cernea | G11C 11/5628 365/185.18 |
| 2010/0080064 A1 | * | 4/2010 | Di Iorio | G11C 16/3427 365/185.19 |
| 2012/0182782 A1 | * | 7/2012 | Kurjanowicz | G11C 17/16 365/94 |

(Continued)

*Primary Examiner* — Khamdan Alrobaie
(74) *Attorney, Agent, or Firm* — Anthony Canale; Andrew M. Calderon; Roberts Mlotkowski Safran Cole & Calderon, P.C.

(57) ABSTRACT

The present disclosure relates to a method of a non-volatile one time programmable memory (OTPM) including parallel programming of all banks of the OTPM by programming two rows per bank at a time, verifying the programming by comparing a first row of the two rows per bank, and verifying the programming by comparing a second row of the two rows per bank.

20 Claims, 6 Drawing Sheets

(56) References Cited

U.S. PATENT DOCUMENTS

2013/0033929 A1* 2/2013 Kim .................. G11C 13/0004
365/163
2016/0118117 A1* 4/2016 Park .................. G11C 13/0069
365/148

* cited by examiner

| | | Program Cycle 0 | Read Cycle 0 | Program Cycle 1 | Read Cycle 1 | Program Final |
|---|---|---|---|---|---|---|
| Cell <i> D=1 | | | DOUT=1 Matches D | | DOUT=1 Match | |
| Cell <j> D = 1 | | | DOUT=0 Mismatch with D | | DOUT=1 Match | |
| | T   C | VTt   VTc | | VTt   VTc | | VTt   VTc |

PARALLEL PROGRAMMING OF ONE TIME PROGRAMMABLE MEMORY ARRAY FOR REDUCED TEST TIME

FIELD OF THE INVENTION

The present disclosure relates to parallel programming of a one time programmable memory array, and more particularly, to parallel programming of a one time programmable memory array for reduced test time.

BACKGROUND

There are various types of one-time programmable memory (OTPM) arrays that represent embedded non-volatile memory (NVM) technologies. In an OTPM, a write operation occurs over many write-verify cycles to achieve a large threshold shift of a memory cell. Further, depending on mismatches within an OTPM high threshold voltage (HVT) twin cell, the number of write-verify cycles may vary significantly. Each of the write operations include a write followed by a verify (i.e., read) to check if the cell is written.

In OTPM systems, the operations of the memory are performed one address at a time. For example, a single write operation may take approximately 8 milliseconds. In this situation, writing the entire memory in an OTPM system can take approximately 65 seconds (i.e., 8 banks, 256 rows, and 4 columns per bank for each write operation). Further, in OTPM systems, there is no ability to test wordline decoders of the customer array before shipping the product. Therefore, an OTPM system which reduces test time through parallel programming and adds sacrificial test input/output (IO) logic to verify the design is desired.

SUMMARY

In an aspect of the disclosure, a method of a non-volatile one time programmable memory (OTPM) includes parallel programming of all banks of the OTPM by programming two rows per bank at a time, verifying the programming by comparing data in a first row of the two rows per bank, and verifying the programming by comparing data in a second row of the two rows per bank.

In another aspect of the disclosure, a method of a non-volatile one time programmable memory (OTPM) includes writing a data input to two rows per bank of the OTPM at a time in parallel, verifying the written data input by comparing data in a first row of the two rows per bank of the OTPM, verifying the written data input by comparing data in a second row of the two rows per bank of the OTPM, and preventing time dependent dielectric breakdown of one time programmable bit cells in the OTPM using overwrite protection.

In another aspect of the disclosure, a structure of a non-volatile one time programmable memory (OTPM) includes a plurality of wordline drivers to provide parallel programming, a plurality of memory banks which are parallel programmed by the wordline drivers, and two rows of each memory bank are parallel programmed by the wordline drivers, a set of input/output (IO) logic, and a set of sacrificial input/output (IO) logic which comprises a set of test data lines for each memory bank.

BRIEF DESCRIPTION OF THE DRAWINGS

The present disclosure is described in the detailed description which follows, in reference to the noted plurality of drawings by way of non-limiting examples of exemplary embodiments of the present disclosure.

DETAILED DESCRIPTION

The present disclosure relates to parallel programming of a one time programmable memory (OTPM) array, and more particularly, to parallel programming of a one time programmable memory array for a reduced test time. In more specific embodiments, the present disclosure relates to a one time programmable memory array which uses a twin-cell and a pair of field effect transistors (FETs) programmed with a threshold voltage (Vt) shift using charge trapped in the oxide of the FETs (i.e. a charge trap memory). Advantageously, by implementing parallel programming of the OTPM array and adding sacrificial data lines to the array, test time per chip is reduced and wordline decoders and drivers are tested before shipping to customers.

In embodiments, parallel writing in the OTPM is supported when the overwrite protection is moved to an array containing test input/output (IO) (i.e., test data lines). Further, in embodiments of the present disclosure, the write operations will follow a write, verify A, and verify B operation which will select between two local set-reset latches for verify A and verify B. The result of this verify (i.e., read) is that masking is enabled locally within a bank and per sense amplifier side. In an example of the present disclosure, writing an entire memory requires writing 8 banks, 256 rows, and 4 columns. In this situation, side A will contain wordlines 0-127 (i.e., WL0-WL127) and side B will contain wordlines 128-255 (WL128-255). In embodiments, programming both side A wordlines and side B wordlines in parallel is supported. Programming 8 banks and two wordlines per bank in parallel will offer a 16× reduction in programming time.

In embodiments of the present disclosure, a method for performing parallel writes offers significant test time reduction, which makes testing faster, cheaper, and more convenient. Specifically, in OTPM systems without parallel writing, writing an entire memory takes approximately 65 seconds of test time. In contrast, using parallel writing in accordance with aspects of the present disclosure, test time can be reduced to approximately 4 seconds, an approximately 16× reduction in test time. Further, the reduced test time can be accomplished using a write timer which typically performs a write, leak, and verify operation. In the write timer, a second verify operation can be performed, enabling local (per bank/per segment) verify/read per sense amplifier (SA) side (i.e., WL<N> on verify A and WL<N+M> on verify B). Further, "N" represents the first wordline on side A and "M" represents an offset which is linked to a wordline on side B. In addition, since OTPM systems may start up in an unknown state (i.e., array data is "x"), embodiments of the present disclosure provide a test space to write and verify (i.e., read) the OTPM before shipping to the product to a customer. This feature enables screening of the memory to failed wordline decoders and drivers and testing various functions of the memory without programming and consuming the customer array space.

Figure 1:
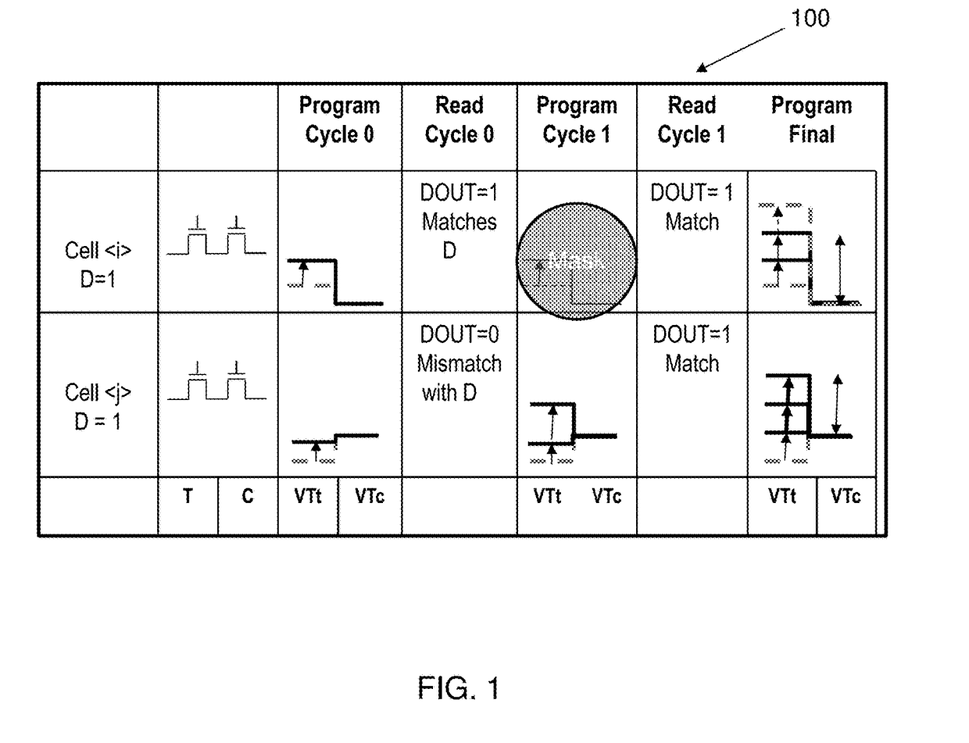
FIG. 1 shows a multi-step write with overwrite protection in accordance with aspects of the present disclosure.

FIG. 1 shows a multi-step write with overwrite protection in accordance with aspects of the present disclosure. In embodiments, a table 100 is shown in which a cell<i> is a twin cell which includes a transistor T (i.e., true transistor) and a transistor C (i.e., complement transistor). Both the transistor T and the transistor C are NFET transistors. Further, the dashed line in table 100 represents the threshold voltage Vth before programming, and the solid line represents the threshold voltage Vth after programming the cell.

In FIG. 1, in an example of operation, when the cell<i> receives a data input D of 1 (i.e., D=1), the cell<i> is programmed. During program cycle 0, after programming, the solid line is the threshold voltage Vth (i.e., VTt) after it has moved up from the dashed line (i.e., the dashed line represents Vth before programming). Therefore, since VTt is greater than VTc, a match occurs such that data out matches data in (i.e., cell was successful programmed and no further writes are required). Further, during the read cycle 0, the data output Dout matches the data input D (i.e., Dout=1 while D=1). Then during a program cycle 1, the cell<i> is masked so that future writes will not occur (i.e., the cell is already programmed to the correct logic state). At the read cycle 1, the data output Dout still matches the data input D (i.e., Dout=1).

Still referring to FIG. 1, in another example of operation, when the cell<j> receives a data input D of 1 (i.e., D=1), the cell<j> is programmed. During program cycle 0, after programming, the solid line is the threshold voltage Vth (i.e., VTt) after it has moved up from the dashed line (i.e., the dashed line represents Vth before programming). However, in this situation, the threshold voltage Vth of the transistor T (i.e., VTt) is less than the threshold voltage Vth of the transistor C (i.e., VTc). Therefore, since VTt is less than VTc, a mismatch occurs. As shown in the read cycle 0, the data output Dout does not match the data input D (i.e., Dout=0 while D=1) and programming must continue to cell<j>.

Since a mismatch occurred, another write is performed, and the threshold voltage Vth of the transistor T (i.e., VTt) is shifted up during program cycle 1. Then, during the read cycle 1, the threshold voltage Vth of the transistor T (i.e., VTt) is greater than the threshold voltage Vth of the transistor C (i.e., VTc). Thus, a match occurs (i.e., Dout=1 while D=1) no further programming is required and the write operation is masked off to disable further write operations. In addition, in table 100, the sense amplifier (SA) is tilted in the opposite direction to require more writes (i.e., gives more margin). This causes the first few reads to fail (i.e., an example is read cycle 0 in cell<j>), and then writing cell<j> is continued by shifting the threshold voltage Vth more on each write cycle (as shown in program cycle 1 and the program final stage).

In the table 100, the threshold voltage Vth of the transistor T (i.e., VTt) is continuously shifted upwards. However, if there is no overwrite protection (e.g., no bit masking), programming operations will continue on each write cycle. The programming operation of a charge storage memory puts a very large stress on the cell which pushes the reliability of the transistor during programming. Without overwrite protection, there is a high probability of Time Dependent Dielectric Breakdown (TDDB) failures.

In OTPM systems, overwrite protection is embedded in the input/output (IO). Thus, overwrite protection is enabled per data line, and gets combined with bit masking (i.e., QMASKENP), segment write enable (i.e., SWE/TSWE), and write test IO or normal/redundant IO (i.e., MTESTIO). However, in such OTPM systems, the bank read local data lines (RLDL) are OR'ed together across the other banks to form a read global data line (RGDL). In OTPM system, the OR'ed read local data lines to form a read global data line prevents parallel programming as only a single address may be masked for future write operations. The two rows in the sense amplifier correspond to each side of the sense amplifier. Further, only one side of the sense amplifier can be sensed or read at one time. Therefore, IO overwrite protection cannot be used when reading two rows and eight banks. For example, in an OTPM programming operation, if one cell passes the read, all other writes would be masked, thereby eliminating the possibility for parallel programming with overwrite protection.

Figure 2:
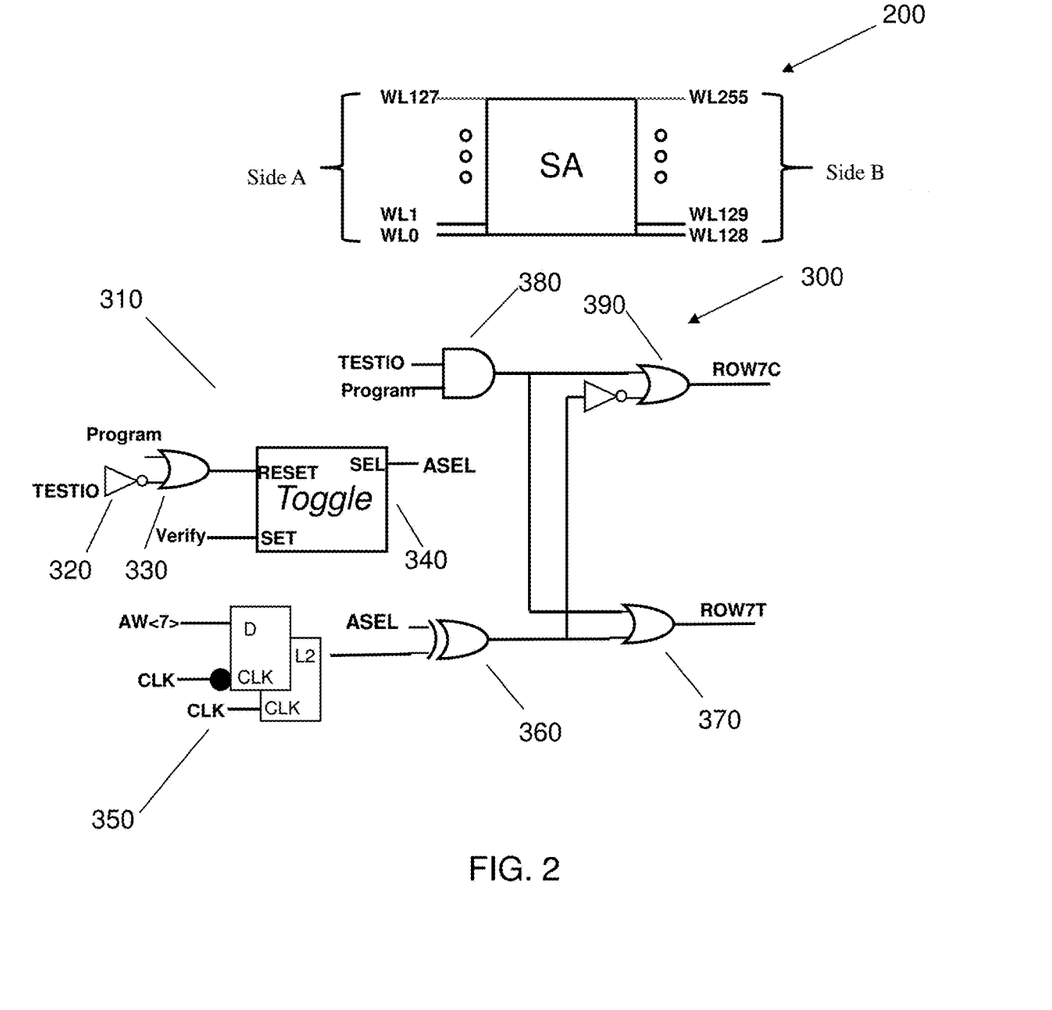
FIG. 2 shows a sense amplifier with supporting logic to support parallel writes with verify operations to two rows in a bank in accordance with aspects of the present disclosure.

FIG. 2 shows a sense amplifier with supporting logic to support parallel writes with verify operations to two rows in a bank in accordance with aspects of the present disclosure. In embodiments of the present disclosure, parallel writes can occur if the overwrite protection is moved to an array for the test input/output (IO) only. In other words, each bank of the OTPM system will have individual test IO lines which supports local overwrite protection. Further, in embodiments of the present disclosure, the write operations will follow a write, verify A (i.e., read/verify one side of the sense amplifier), verify B (i.e. read/verify other side of the sense amplifier) operation which will select between two local set-reset latches for verify A and verify B. The result of the verify (i.e., read) is that masking locally within a bank and per sense amplifier side is enabled. In an example, side A is wordlines 0 to 127 (i.e. WL0-WL127) and side B is wordlines 128 to 255 (i.e., WL128-WL255).

In FIG. 2, a sense amplifier with word line structure 200 is shown. On the left side of the sense amplifier with word line structure 200, wordlines 0 to 127 (i.e. WL0-WL127) are shown on side A. Further, on the right side of the sense amplifier with word line structure 200, wordlines 128 to 255 (i.e., WL128-WL255) are shown on side B. FIG. 2 also includes a row structure 300 and a toggle structure 310. The row structure 300 includes a flip flop structure 350, an exclusive OR logic 360, an OR logic 370, an AND logic 380, and an OR logic 390. The toggles structure 310 includes an inverter 320, an OR gate 330, and a toggle logic 340.

In FIG. 2, during a write in the row structure 300, both sides of the sense amplifier are enabled when the program signal and the TESTIO signal are 1 (i.e., TESTIO=1 and program=1). Further, during a read (i.e., either verify A or verify B), the side of the sense amplifier is determined by the verify signal and the AW<7> signal. For example, in operation, when the verify signal is 0 (i.e., verify=0), the left side (i.e., side A) is selected. In contrast, when the verify signal is 1 (i.e., verify=1), the right side (i.e., side B) is selected. In other words, when the ROW7C signal is 1 (i.e., ROW7C=1), the left side (i.e., side A) is selected/enabled. Further, when the ROW7T signal is 1 (i.e., ROW7T=1), the right side (i.e., side B) is selected/enabled.

In FIG. 2, if the program signal input to the OR gate is 1 (i.e., program=1), then the left side (i.e., side A) is selected/enabled. Further, if the TESTIO signal is 0 (i.e., TESTIO=0), then the left side (i.e., side A) is selected/enabled. Further, if ASEL signal is 0 (i.e., ASEL=0), then ROW7C/ROW7T will depend only on AW<7>. Please also note that TESTIO=0 during normal reads. In this way, either the left side (i.e., side A) or the right side (i.e., side B) will be selected/enabled.

Figure 3:
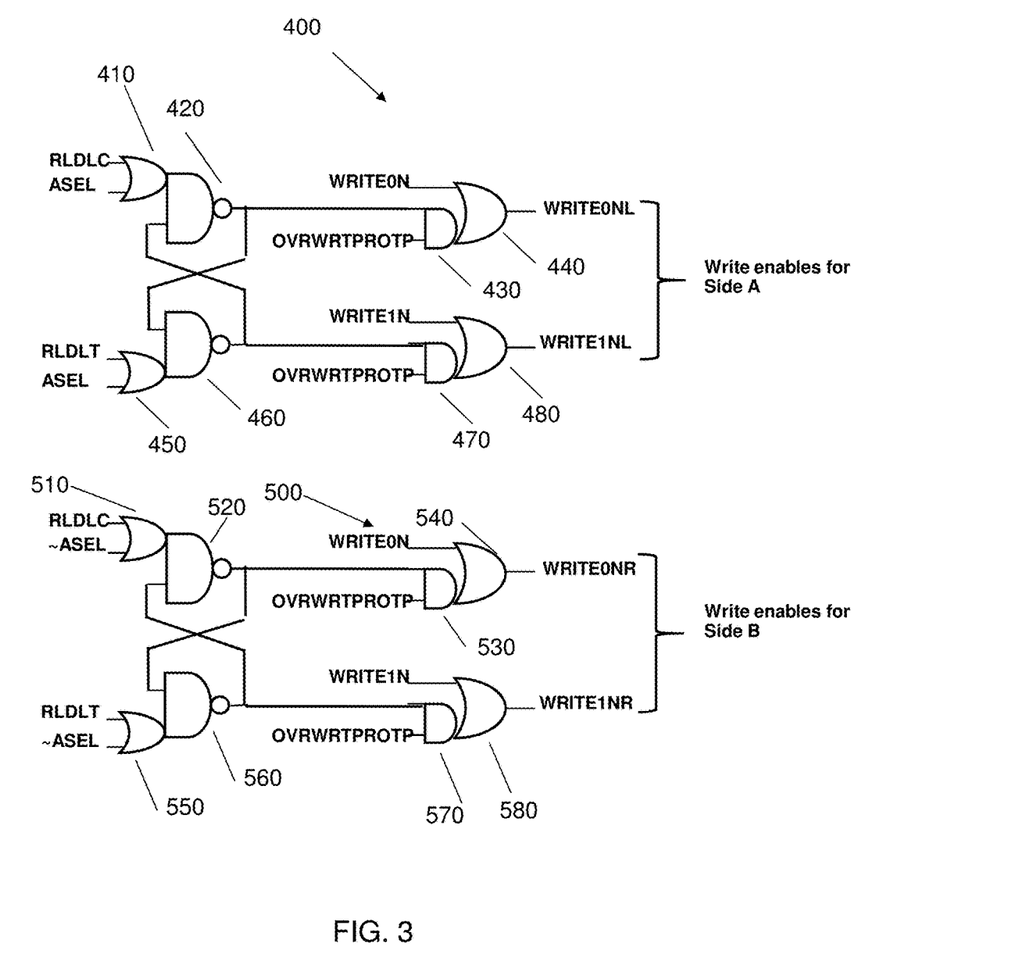
FIG. 3 shows local overwrite protection of a sense amplifier to support parallel writes in accordance with aspects of the present disclosure.

FIG. 3 shows local overwrite protection of the sense amplifier to support parallel writes in accordance with aspects of the present disclosure. In FIG. 3, the local overwrite protection for side A 400 includes an OR logic 410, a NAND logic 420, an AND logic 430, an OR gate 440, an OR logic 450, a NAND logic 460, an AND logic 470, and an OR logic 480. Further, in FIG. 3, the local overwrite protection for side B 500 includes an OR logic 510, a NAND logic 520, an AND logic 530, an OR gate 540, an OR logic 550, a NAND logic 560, an AND logic 570, and an OR logic 580. Further, the local overwrite protection for side A 400 and the local overwrite protection for side B 500 are connected and commanded through signals which read local data lines output from the sense amplifier, as explained below.

In FIG. 3, a read local data line complement (RLDLC) reads a data line output from the sense amplifier. The read local data line complement RLDLC pulses low when reading a "0" output from the data line output. Further, another read local data line true (RLDLT) reads a data line output from the sense amplifier. The read local data line true RLDLT pulses low when reading a "1" output from the data line output. In FIG. 3, an ASEL signal selects one of the set reset (SR) latches. The ASEL signal is driven from the toggle logic 340. The overwrite protection signal OVRWRT-PROTP is disabled for the first write cycle in order to guarantee at least one write cycle will occur in a cell of the OTPM. After the first write cycle, the cell of the OTPM is checked (i.e., read/verify) to see if the programming was successful (i.e., if DOUT=1 while D=1). If the data output signal DOUT is matched to the data input D, then future writes will be masked.

In FIG. 3, output write enable for left side signals WRITE0NL and WRITE1NL are write enables for side A dependent on the data in (i.e. logic 1 or logic 0). Further, output write enable for right side signals WRITE0NR and WRITE0NR are write enables for side B. One of ordinary skill in the art would also understand that the ~ASEL signal are inverted signals of the ASEL signal to select the write enables for side A or side B.

Figure 4:
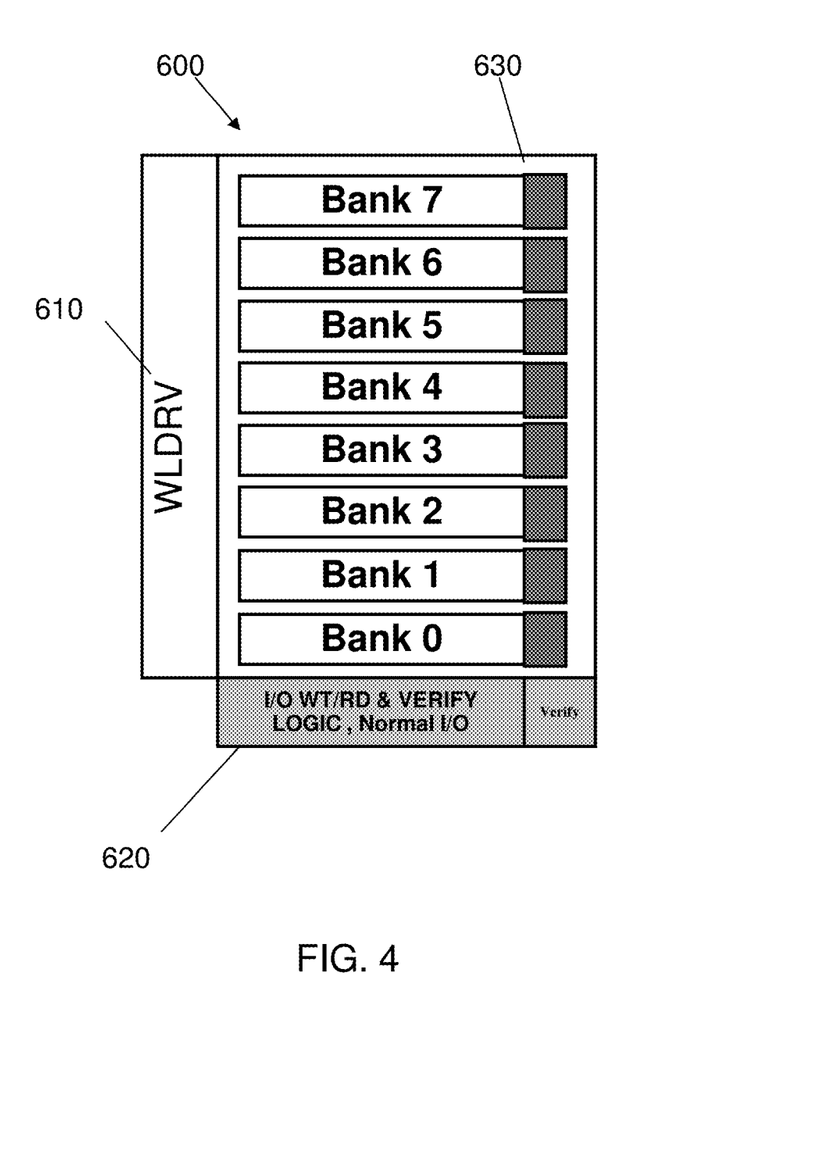
FIG. 4 shows a memory bank with test lines in accordance with additional aspects of the present disclosure.

FIG. 4 shows a memory bank with test lines (i.e., sacrificial data lines) in accordance with additional aspects of the present disclosure. In FIG. 4, the memory bank 600 of the OTPM includes a wordline driver WLDRV 610, an IO structure 620 includes I/O WT/RD, Verify Logic, and Normal I/O. In FIG. 4, the memory bank 600 also includes corresponding test data lines 630. The test data lines 630 test all wordline drivers from the wordline driver WLDRV 610. With the addition of test line data lines 630, testing of every wordline driver in the memory bank 600 can be accomplished without writing in a customer array. In contrast, in current OTPM systems, there is no way to test customer wordline drivers for functionality. Specifically, in current OTPM systems, since the memory is one time programmable, there is no way to write and read a customer array and test the wordline drivers before shipping the product.

In FIG. 4, the memory bank 600 of the OTPM requires approximately 65 seconds to write the entire memory bank 600 (i.e., 8 banks*256 rows*4 columns*8 ms each=approximately 65 seconds). Also, the overwrite protection and verify/read is only supported for a single address at a time.

Figure 5:
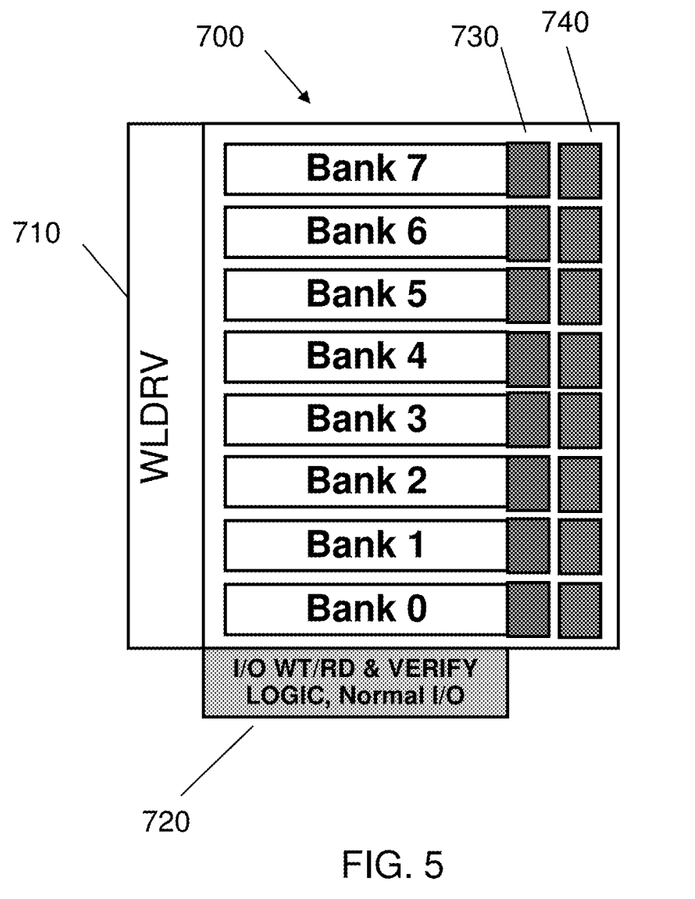
FIG. 5 shows a memory bank with test lines and local overwrite protection in accordance with additional aspects of the present disclosure.

FIG. 5 shows a memory bank with test lines (i.e., sacrificial data lines) and local overwrite protection in accordance with additional aspects of the present disclosure. In FIG. 5, the memory bank 700 of the OTPM includes a wordline driver 710, an IO structure 720 includes I/O WT/RD, Verify Logic, and Normal I/O. In FIG. 5, the memory bank 700 also includes test data lines 730 and local overwrite protection 740. Similar to FIG. 4, the test data lines 730 test all wordline drivers from the wordline driver WLDRV 710. With the addition of test data lines 730, testing of every wordline driver in the memory bank 700 can be accomplished without writing in a customer array.

In FIG. 5, the local overwrite protection 740 enables parallel writes of all banks and two rows per bank. Therefore, in embodiments of the present disclosure, when a write is performed, rows of side A are verified, and then rows of side B are verified. Thus, the memory bank 700 including test data lines 730 and local overwrite protection 740 provides local overwrite protection and verifying logic per bank and per segment. In addition, the memory bank 700 of the OTPM requires only approximately 4 seconds, which is a 16 times reduction in programming time over known OTPM systems (i.e., 128 rows*1 bank*4 columns*8 ms each=approximately 4 seconds). Thus, when enabling parallel writing of all banks and programming two word lines (e.g., rows) per bank at a time, there is a significant reduction in test time (i.e., 4 seconds versus 65 seconds in known OTPM systems).

In FIG. 5, a structure of a non-volatile OTPM can include a plurality of wordline drivers 710, a plurality of memory banks included in the memory bank 700, a set of input/output (I/O) logic 720, a set of sacrificial input/output logic which includes test data lines 730 for each memory bank and an overwrite protection logic 740 for each memory bank. The overwrite protection logic 740 prevents time dependent dielectric breakdown of one time programmable bit cells of the OTPM by making writes and verify operations locally once a cell is written with a tester tunable margin. A time dependent dielectric breakdown is a failure from programming, which is detected as a read failure due to bit line leakage and an oxide breakdown. Further, each of the test data lines 730 corresponding to a memory bank enable testing for each of the wordline drivers 710 in the OTPM without writing in the set of IO logic 720.

Figure 6:
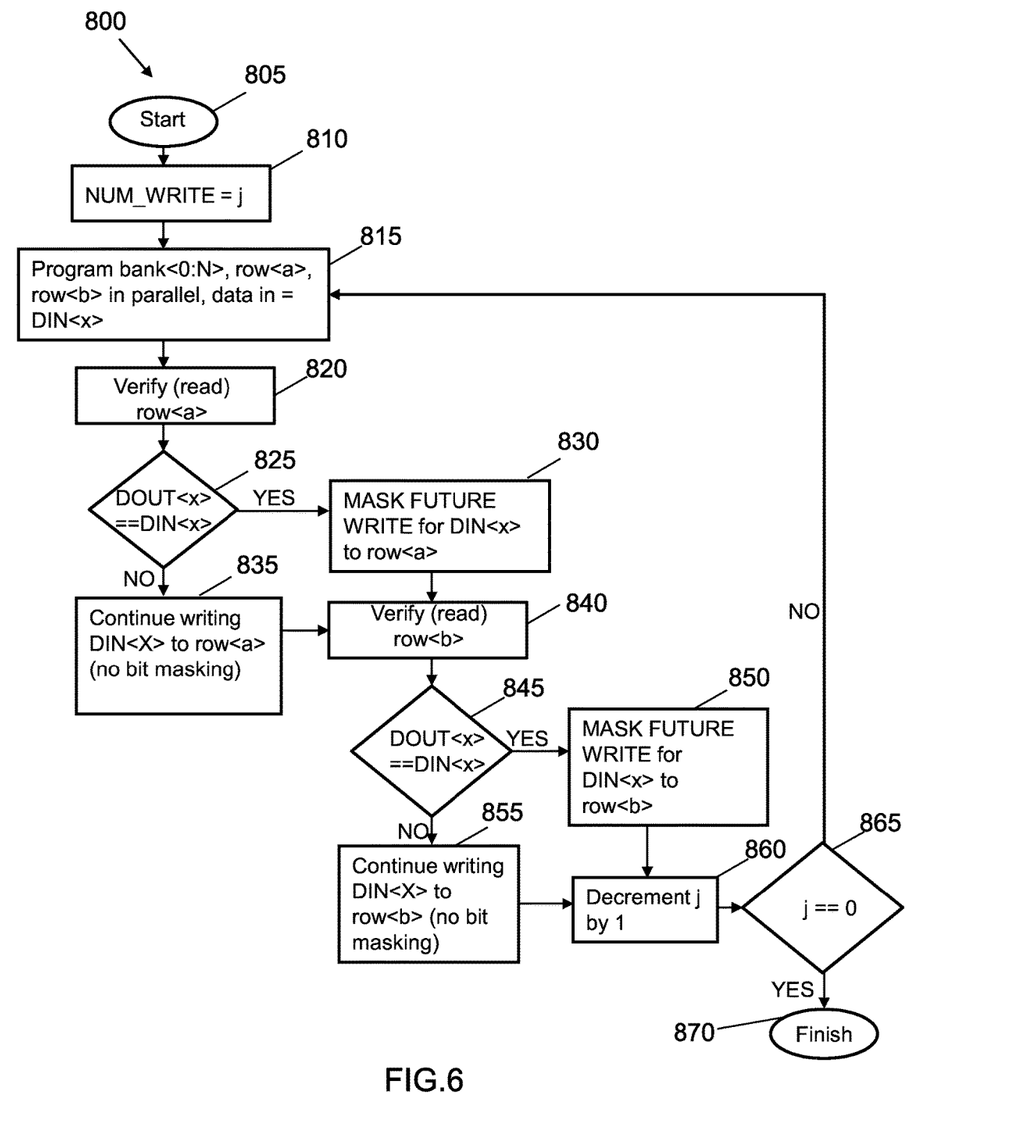
FIG. 6 shows a method of a non-volatile one time programmable memory in accordance with additional aspects of the present disclosure.

FIG. 6 shows a method of a non-volatile one time programmable memory in accordance with additional aspects of the present disclosure. In FIG. 6, the flowchart 800 shows a method of the non-volatile one time programmable memory in accordance with the embodiments of the present disclosure. In FIG. 6, the method starts at step 805. Then, at step 810, a write and verify of side A and side B can occur. In step 810, the number of the writes to be performed $NUM_{13}$ WRITE is user programmable to an integer value of "j". At step 815, the bank<0:N> will be programmed (N specifies the total number of banks). Further, row<a> of side A and row<b> of side B are programmed in parallel. The data input is written as DIN<x>. At steps 820 and 825, there is a verify (i.e., read) of row<a> to check whether the data input DIN<x> matches the data output DOUT<x>. If there is no match between DOUT<x> and DIN<x>, then the method moves to step 835. At step 835, the method continues to write the data input DIN<x> to row<a> (i.e., since there is no bit masking). In contrast, if there is a match between DOUT<x> and DIN<x>, there is masking of future writes for DIN<x> to row<a> at step 830, and no future writes occur for row<a>.

After either step 830 or step 835 is performed, the method moves to step 840. In steps 840 and 845, there is a verify (i.e., read) of row<b> to check whether the data input DIN<x> matches the data output DOUT<x>. If there is no match between DOUT<x> and DIN<x>, then the method moves to step 855. At step 855, the method continues to write DIN<x> to row<b> (i.e., since there is no bit masking). In contrast, if there is a match between DOUT<x> and DIN<x>, there is masking of future writes for DIN<x> to row<b> at step 850 and no future writes occur for row<b>.

After either step 850 or 855 is performed, the method moves to step 860. At step 860, "j" is decremented by 1. If "j" is equal to zero (i.e., no more writes needed), then the method is finished at step 870. However, if there are still writes that need to be performed (i.e., "j" is not equal to zero at step 865), then the method returns to step 815, and then the method continues again.

As should now be understood, in embodiments of the present disclosure, a method of a non-volatile OTPM can include parallel programming of all banks of the OTPM by programming two rows per bank at a time, verifying the programming by comparing data in a first row of the two rows per bank, and verifying the programming by comparing data in a second row of the two rows per bank. The method can also prevent time dependent dielectric breakdown of one time programmable bit cells in the OTPM using overwrite protection by making write locally once a cell in the OTPM is written with a tester tunable margin.

Also, the parallel programming can include writing a data input to the two rows per bank at the time in parallel. The verification of the programming can include comparing the written data input to a data input in a corresponding row to determine whether there is a match between the written data input and the data output. If there is a match, future writes may be masked in the corresponding row. In contrast, if there is a mismatch, the data input will be written again in the corresponding row.

The parallel programming of a one time programmable memory array of the present disclosure can be manufactured in a number of ways using a number of different tools. In general, though, the methodologies and tools are used to form structures with dimensions in the micrometer and nanometer scale. The methodologies, i.e., technologies, employed to manufacture the parallel programming of a one time programmable memory array of the present disclosure have been adopted from integrated circuit (IC) technology. For example, the structures are built on wafers and are realized in films of material patterned by photolithographic processes on the top of a wafer. In particular, the fabrication of the parallel programming of a one time programmable memory array uses three basic building blocks: (i) deposition of thin films of material on a substrate, (ii) applying a patterned mask on top of the films by photolithographic imaging, and (iii) etching the films selectively to the mask.

The method(s) as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed:

1. A method of a non-volatile one time programmable memory (OTPM), comprising:
   parallel programming of all banks of the OTPM by programming two rows per bank at a time;
   verifying the programming by comparing data in a first row of the two rows per bank;
   verifying the programming by comparing data in a second row of the two rows per bank; and
   testing a plurality of wordline drivers of the OTPM using a set of test data lines without writing in a selected array of the banks.

2. The method of claim 1, wherein the parallel programming of all banks of the OTPM by programming two rows per bank at the time comprises writing a data input to the two rows per bank at the time in parallel.

3. The method of claim 2, wherein the verifying the programming by comparing data in the first row of the two rows per bank comprises comparing the written data input to a data output in the first row to determine whether there is a match between the written data input and the data output.

4. The method of claim 3, wherein in response to determining there is a match between the written data input and the data output in the first row, masking future writes for the data input in the first row.

5. The method of claim 3, wherein in response to determining there is a mismatch between the written data input and the data output in the first row, continuing to write the data input to the first row.

6. The method of claim 2, wherein the verifying the programming by comparing data in the second row of the two rows per bank comprises comparing the written data input to a data output in the second row to determine whether there is a match between the written data input and the data output.

7. The method of claim 6, wherein in response to determining there is a match between the written data input and the data output in the second row, masking future writes for the data input in the second row.

8. The method of claim 6, wherein in response to determining there is a mismatch between the written data input and the data output in the second row, continuing to write the data input to the second row.

9. The method of claim 1, further comprising preventing time dependent dielectric breakdown of one time programmable bit cells in the OTPM using overwrite protection by masking writes locally once a cell of the OTPM is written with a tester tunable margin.

10. A method of a non-volatile one time programmable memory (OTPM), comprising:
    writing a data input to two rows per bank of the OTPM at a time in parallel;

verifying the written data input by comparing data in a first row of the two rows per bank of the OTPM;

verifying the written data input by comparing data in a second row of the two rows per bank of the OTPM;

testing a plurality of wordline drivers of the OTPM using a set of test data lines without writing in a selected array of a plurality of banks in the OTPM; and preventing time dependent dielectric breakdown of one time programmable bit cells in the OTPM using overwrite protection.

11. The method of claim 10, wherein the verifying the written data input by comparing data in the first row of the two rows per bank comprises comparing the written data input to a data output in the first row to determine whether there is a match between the written data input and the data output.

12. The method of claim 11, wherein in response to determining there is a match between the written data input and the data output in the first row, masking future writes for the data input in the first row.

13. The method of claim 11, wherein in response to determining there is a mismatch between the written data input and the data output in the first row, continuing to write the data input to the first row.

14. The method of claim 10, wherein the verifying the written data input by comparing data in the second row of the two rows per bank comprises comparing the written data input to a data output in the second row to determine whether there is a match between the written data input and the data output.

15. The method of claim 14, wherein in response to determining there is a match between the written data input and the data output in the second row, masking future writes for the data input in the second row.

16. The method of claim 14, wherein in response to determining there is a mismatch between the written data input and the data output in the second row, continuing to write the data input to the second row.

17. The method of claim 10, wherein the overwrite protection occurs by masking writes locally once a cell of the OTPM is written with a tester tunable margin.

18. A structure of a non-volatile one time programmable memory (OTPM), comprising:

a plurality of wordline drivers to provide parallel programming;

a plurality of memory banks which are parallel programmed by the wordline drivers, wherein two rows of each memory bank are parallel programmed by the wordline drivers;

a set of input/output (TO) logic; and a set of sacrificial input/output (TO) logic which comprises a set of test data lines in each memory bank, wherein the set of test data lines are used to test each of the plurality of wordline drivers without writing in a selected array of the plurality of memory banks.

19. The structure of claim 18, wherein the set of sacrificial IO logic further comprises an overwrite protection logic for each memory bank which prevents time dependent dielectric breakdown of one time programmable bit cells of the OTPM by making writes locally once a cell is written with a tester tunable margin.

20. The structure of claim 18, wherein the test data lines in each memory bank further enables testing for each of the plurality of wordline drivers in the OTPM without writing in the set of IO logic.

* * * * *